United States Patent [19]
Khandros

[11] Patent Number: 5,852,871
[45] Date of Patent: Dec. 29, 1998

[54] METHOD OF MAKING RAISED CONTACTS ON ELECTRONIC COMPONENTS

[75] Inventor: Igor Y. Khandros, Orinda, Calif.

[73] Assignee: Form Factor, Inc., Livermore, Calif.

[21] Appl. No.: 570,230

[22] Filed: Dec. 11, 1995

Related U.S. Application Data

[62] Division of Ser. No. 152,812, Nov. 16, 1993, Pat. No. 5,476,211.

[51] Int. Cl.$^6$ ....................................................... H01R 9/06
[52] U.S. Cl. .......................... 29/843; 228/4.5; 228/180.5; 228/199; 257/777; 324/754
[58] Field of Search .................. 29/840, 843; 228/179.1, 228/180.21, 180.22, 180.5, 4.5; 257/777; 324/754

[56] References Cited

U.S. PATENT DOCUMENTS

| | | |
|---|---|---|
| 3,271,851 | 9/1966 | Hayes . |
| 3,842,189 | 10/1974 | Southgate . |
| 4,955,523 | 9/1990 | Carlomagno et al. . |
| 5,294,039 | 3/1994 | Pai et al. . |
| 5,476,211 | 12/1995 | Khandros . |

*Primary Examiner*—Carl J. Arbes
*Attorney, Agent, or Firm*—David Larwood; Gerald Linden

[57] ABSTRACT

A method for manufacturing raised contacts on the surface of an electronic component includes bonding one end of a wire to an area, such as a terminal, of the electronic component, and shaping the wire into a wire stem configuration (including straight, bent two-dimensionally, bent three-dimensionally). A coating, having one or more layers, is deposited on the wire stem to (i) impart resilient mechanical characteristics to the shaped wire stem and (ii) more securely attach ("anchor") the wire stem to the terminal. Gold is one of several materials described that may be selected for the wire stem. A variety of materials for the coating, and their mechanical properties, are described. The wire stems may be shaped as loops, for example originating and terminating on the same terminal of the electronic component, and overcoated with solder. The use of a barrier layer to prevent unwanted reactions between the wire stem and its environment (e.g., with a solder overcoat) is described. Bonding a second end of the wire to a sacrificial member, then removing the sacrificial member, is described. A plurality of wire stems may be formed on the surface of the electronic component, from different levels thereon, and may be severed so that their tips are coplanar with one another. Many wire stems can be mounted, for example in an array pattern, to one or to both sides of electronic components including semiconductor dies and wafers, plastic and ceramic semiconductor packages, and the like.

11 Claims, 13 Drawing Sheets

METHOD OF MAKING RAISED CONTACTS ON ELECTRONIC COMPONENTS

CROSS-REFERENCE TO RELATED APPLICATIONS

This is a division of commonly-owned U.S. patent application Ser. No. 08/152,812, filed Nov. 16, 1993 (U.S. Pat. No. 5,476,211; Dec. 19, 1995).

BACKGROUND OF THE INVENTION

This invention relates in general to electronic assemblies and testing thereof. In particular, the invention relates to a method of manufacture of protruding, controlled aspect ratio and shape contacts for uses in interconnections of assemblies and testing thereof.

Interconnections which involve protruding electrical contacts are used extensively in packaging of electronics. Pin grid array packages, both plastic and ceramic, housing a variety of semiconductors, use area arrays of pins as interconnect contacts for connection to circuit boards. Pins can be attached to their receiving package conductors by use of a variety of methods. For ceramic packages, pins are inserted into non-reacting brazing fixtures and are then gang-brazed to corresponding conductive terminals on the package. This approach is characterized by significant non-recurring engineering costs and lead times involved in production of the brazing fixture. Plastic pin grid array packages most commonly use pins which are inserted into metallized through holes in a circuit board, while the dimensions of pins and the holes normally chosen to facilitate good contact between the walls of the pins and the coating of the holes. This approach has a disadvantage in that the coated holes and the pins block some circuit routing channels within the circuit board, thus forcing either use of narrow circuit traces, or increase in circuit board area, either of which results in increased costs.

Permanent connection of the pin grid array packages to circuit boards often is accomplished by inserting pins through corresponding holes in a circuit board, the pins protruding to a predetermined length beyond the circuit board. A resulting assembly then is passed through a wave soldering machine, and the pin grid array thus is soldered to the circuit board. Alternatively, a pin grid array can be inserted into a low insertion force or zero insertion force socket for a demountable assembly. Such a socket, in its turn, normally is connected permanently to a board.

A current trend in interconnections is toward face-to-face surface mounting of components to boards and semiconductor chips to substrates. This approach is best accomplished with protruding contact structures on top of (or otherwise protruding from) contact carrying conductive terminals or traces. Conductive terminal arrangements on facing components and substrates are increasingly being made of the area array type, as this allows for larger contact-to-contact separation as compared with components characterized by peripheral arrangement of interconnection contacts.

Pins attached to either ceramic or plastic packages according to the traditional methods are, in general, not appropriate for mounting to patterns of surface contacts on circuit boards, due to pin length variation. For surface mounting, the pins would have to be planarized, which represents an additional expensive step subsequent to pin assembly. In addition, there is a significant cost penalty associated with production of pin-carrying packages with pin-to-pin separations of 50 mils, or lower.

There is currently an increasing need for a low cost method of attaching protruding contacts from conductive terminals, arising from proliferation of surface mountable area array contact packages. Stand-off height of protruding contacts is particularly important when coefficients of thermal expansion of components and of circuit board materials differ significantly. The same is true for attachment of un-packaged semiconductor chips to interconnection substrates. These expansive concerns call for a low cost, high volume method of manufacturing protruding, controlled aspect ratio or shape electrical contacts on top of (or otherwise protruding from) contact carrying conductive terminals, on top of any device or circuit bearing substrate, board material or component, and its applications to surface mount interconnections of devices, components and substrates.

THE PRIOR ART

U.S. Pat. Nos. 5,189,507, 5,095,187 and 4,955,523 disclose a method of manufacturing of controlled height protruding contacts in a shape of wires for direct soldering to a mating substrate. The wires are bonded to terminals without use of any material other than that of wire and the terminals, using ultrasonic wirebonding methods and equipment, which comprises a standard industry technique for interconnecting semiconductor chips to packages. The patents also describe a bonding head which incorporates a wire weakening means for controlling length of free standing severed wires. Vertically free standing wires present a handling problem during assembly, which is addressed in the patents by providing for polymer encapsulation of bonds between the wires and terminals. The polymer coating, which is optional, also compensates for another disadvantage of the approach, namely weak points along the wire, typically the point of contact between the wire and terminal metallization, and in case of ball bonding, in a heat effected zone of the wire just above impression of a bonding capillary. While these patents provide for controlled height contacts, and discuss 2 d to 20 d aspect ratios, in practice they do not assume controlled aspect ratios for all kinds of protruding contacts which are required in various applications. For instance, standard, high speed wirebonding equipment could not handle a 30 mil diameter wire. Therefore, according to these inventions, a 30 mil diameter, 100 mil high contact could only be produced on lower throughput specialized equipment, at higher cost. In addition, a gold wire as described in a preferred embodiment, would have a problem of dissolving in solder during a soldering cycle, which causes long term reliability problems with solder joints. Similarly, direct soldering of copper contacts would in many cases result in undesirable reaction between copper and solder at elevated temperatures. While nickel metal is the material of choice for solder joint reliability, nickel wire can not be used for ultrasonic wirebonding to metal terminals due to its high mechanical strength and passivating, oxide forming properties. Chemical, physical and mechanical properties, as well as permissible dimensions and shapes of the protuberant contacts produced according to this invention are limited to the capabilities and materials choices compatible with known wire bonding techniques.

U.S. Pat. No. 3,373,481 describes a method of interconnecting semiconductor components on substrates by means of dissolving protruding gold projections on the components in solder masses formed on the substrate terminals. The gold projections are formed by compression and extrusion of gold balls against the terminals. This approach is incapable of producing high aspect ratio protruding contacts because of limitations of the extrusion method. In addition, dissolution of gold in solder, as taught by this approach creates a problem due to reliability concerns. The method also limits selection of contact material to easily extrudable metals, like gold.

There are several methods in the prior art for controlled elongation of solder masses between a component and a substrate. The goal is to create a column-like solder shape, preferably an hourglass shape, in order to achieve increased resistance to thermal cycling. To that end, U.S. Pat. No. 5,148,968 discloses a web-like device which upon heating during solder reflow stretches the solder connections, forming such hourglass shaped solder columns. Aspect ratios of the columns are determined by the mass of solder in the joint, dimensions of the solder wettable terminals on the substrate and the component, and by the characteristics of the stretch device. This method is only limited to contact materials which are reflowed during the assembly, and requires external hardware for forming the contact shape, which adds cost of the hardware and increases the process complexity.

U.S. Pat. No. 4,878,611 teaches formation of controlled geometry solder joints by applying controlled volumes of solder to a semiconductor package and a substrate, bringing solder masses in contact, and reflowing the solder masses while maintaining controlled separation between the component and the substrate through mechanical means. This approach also requires hardware means for maintaining longitudinal dimension of the contacts, and does not lend itself to standard practices of surface mount soldering, in which industry already has made substantial time and capital investments.

In the same spirit, U.S. Pat. No. 4,545,610 discloses a process for forming elongated solder joints between a plurality of solder wettable terminals on a semiconductor component and a substrate by means of solder extenders, which transform the shape of the solder joints into uniform hourglass shapes during a solder reflow step. This approach requires additional, non-standard processing of either a silicon device, or on a substrate, which includes attachment of reflowable solder extenders, and non-reflowable means of maintaining vertical spacing between the silicon device and the substrate.

U.S. Pat. No. 5,154,341 discloses the use of a spacer bump which is composed of a solder alloy which does not melt at the temperature of component soldering. A eutectic solder microball is placed on a contact, and upon the reflow the reflowable solder encases the non-reflowable spacer, and produces an hourglass shaped joint. The aspect ratios of the joint contacts are controlled by dimensions of the spacer.

U.S. Pat. No. 4,332,341 teaches solid state bonding of solder preforms to components, substrates or both, for further joining. Resulting protruding solder contacts either collapse during soldering if they consist of eutectic solder, or do not reflow at all, when they consist of higher melting temperature solder. In the latter case, a component would not have the benefit of a self-alignment effect as the pool of solder is confined to the vicinity of the terminals, and a main portion of the joint which controls aspect ratio, does not melt.

U.S. Pat. No. 4,914,814 discloses a process for fabricating solder columns through use of a mold with an array of pin holes, which are filled with solder, brought into contact with terminals on a component, and bonded by melting the solder which wets the terminals. The component with columns is then bonded to a substrate through reflow in a solder with lower melting temperature than the solder of the columns. This approach requires generating a mold for each solder column array pattern, commonly involving undesirable non-recurring engineering expenses and associated increase in delivery times.

U.S. Pat. No. 3,509,270 discloses a printed circuit assembly which is interconnected with a dielectric carrier that has a plurality of spring elements positioned in its apertures, the springs are optionally encased in a solder material to facilitate permanent electrical contact between circuit elements. This approach requires a custom interposer pattern manufactured for each application, while solder coated springs would have to be placed individually inside the apertures. Additionally, soldering usually requires flux, while the interposer material makes it difficult to clean flux after the reflow process.

U.S. Pat. Nos. 4,664,309 and 4,705,205 disclose a device and a method for interconnection with reinforced solder preforms which use a retaining member provided with apertures. The retaining member is optionally dissolved to leave resilient interconnect structures. The solder columns maintain their shape in the molten state, supported by particles, filaments, spiral metallic wire or tape. 20 to 80% by weight of filler material is specified. This approach, as several of the above described approaches, requires a custom made retaining member for every interconnect application, and therefore requires an additional non-recurring engineering expense and increased delivery time for every production order.

U.S. Pat. No. 4,642,889 teaches use of an interposer with a plurality of interconnect areas, interconnect areas comprise wire means surrounded with solder, and incorporate a soldering flux material. Upon heating the solder reflows and connects to the terminals of the mating components and boards, while the wires in the middle of each solder joint insure a column-like joint shape. The interposer preferably is dissolved away. While providing means for controlled aspect ratio interconnect joints, this approach also requires use of a custom manufactured interposer and inevitable non-recurring engineering expenses and increased delivery times. In addition, when improved alignment of the interconnect to the terminals is required, as terminal-to-terminal distances decrease, this approach suffers from heat and environmental effects on interposer material, causing it to distort or change dimension during processing steps, which makes the alignment difficult, and limits this approach to relatively coarse terminal-to-terminal pitch applications.

An elongated protruding solder contact is taught according to U.S. Pat. No. 5,130,779, by sequentially encapsulating solder deposits with a barrier metal. This approach insures that a staged solder deposit does not collapse upon reflow, and a controlled aspect ratio solder contact is thus formed. In order for the barrier metal to be effective, the walls of sequentially deposited solder masses must have a slope. Deposition of such a structure of solder is a lengthy and expensive process.

A method of attaching highly compliant leads to an array matrix of contacts on a semiconductor package is disclosed in U.S. Pat. No. 4,751,199. An array of leads is manufactured according to the required pattern with temporary tab structures tying the leads together. Compliant leads are gang bonded to terminals on the semiconductor package, and tabs are removed leaving compliant protruding contact leads, ready for attachment to a substrate. This approach, like the interposer techniques described above, requires specific tooling for every new package with a distinct pattern of the array of contacts.

OBJECTS AND SUMMARY OF THE INVENTION

One object of the present invention is to provide a high volume, low cost manufacturing process for production of precise shape and geometry protuberant conductive contacts on a wide variety of electronic components, the contacts having a controlled set of physical, metallurgical and mechanical properties, bulk and surface. Such protuberant contacts can be employed to satisfy electrical, thermal or geometrical requirements in various aspects of electronic interconnection applications. An inventive, multiple stage process is provided, according to which, first, wire stems are bonded to contact carrying terminals, the stems being shaped in three dimensional space, to define skeletons of the resulting contacts. The conductive contacts are then completed through at least one deposition step of a coating which envelops or jackets the wire skeletons and the terminals. The common coating not only helps to "anchor" protruding contacts to the terminals, but also provides for characteristics of the protuberant contacts with respect to long term stability of their engagement contact with mating electronic component, including but not limited to interconnection substrates, semiconductor devices, interconnect or test sockets. The coating also determines soldering assembly characteristics, as well as long term effects from contact with solder. The coating, along with the wire material properties, determines the mechanical characteristics of the resulting protuberant contact. The wire serves as a "skeleton" of a resulting protruding contact, and the coating serves as its "muscle".

The wire skeleton can be bonded employing high productivity, highly automated ultrasonic, thermosonic and thermocompression wirebonding equipment (hereinafter referred to as ultrasonic wirebonding equipment). The wirebonding equipment can be organized for ball bonding type ultrasonic wirebonding process, typically used for gold or copper wirebonding, but modifiable for use with other types of single phase or noble metal coated wires. Wire skeletons consisting of free standing single or multiple wire stems can be produced. As required by the shape and dimensions of the resulting conductive contacts, the stems can be standing normal to a terminal or at an angle thereto, or can be formed in three dimensional space. Alternatively, wire skeletons produced using an ultrasonic ball bonder can be produced by forming a traditional wire-bonding loop, which originates and terminates on a contact carrying terminal, or which originates on the contact carrying terminal and terminates on a sacrificial conductor outside the terminal area. Then the sacrificial conductor is selectively dissolved away after completion of the contact processing. Optionally, a wedge bonding type ultrasonic wirebonder can be employed, in which case controlled shape loops of wire are formed with both ends of a loop on the same terminal, or they are formed by originating the loops within the area of the terminal and terminating or severing the loops outside the terminals. Both types of wirebonders are available commercially from a variety of suppliers, and are highly automated, with the bonding speeds exceeding 10 wires per second.

An additional object of the present invention is to produce array patterns of contacts for unique component designs, without incurring costs and delays associated with production of unique tooling. This object is achieved through use of a sequential wirebonding process for attaching of the wire skeletons to the terminals, and then overcoating them in a single, non-pattern-specific step. Location targeting and geometric characteristics are entered into an electronic control system of the wirebonding equipment with a specific set of commands. A program controls all aspects of wire forming and shaping process, as well as bond characteristics. Production of the multiple protruding contacts does not require time-limiting and costly production of molds, masks or the like, which otherwise would be specific to every incoming order. This object is exemplified by application of the present invention to production of integrated pin-shaped contacts for ceramic pin grid array packages. This is achieved by bonding straight vertical, single stem skeletons, perpendicular to the surface of terminals, and overcoating them with a conductive structural metal or alloy, consisting substantially of nickel, copper, cobalt, iron or alloys thereof, with the thickness of the deposit determined by the required pin diameter value. This can also be accomplished with equal ease on plastic pin carrying substrates.

Yet another object of the present invention is to create protruding, tower-like solder contacts which substantially maintain a well controlled aspect ratio even when the solder is molten. This object is achieved through first bonding a wire skeleton which will define the final shape and aspect ratio of a solder contact, then optionally overcoating it with a barrier layer which prevents long term reaction between the solder and the wire, and finally depositing a mass of solder which wets the skeleton with a barrier, and clings onto the skeleton even after multiple reflows.

Yet another object of the present invention is to create controlled shape resilient contacts on top of (or otherwise protruding from) contact carrying terminals arranged in various patterns, including arrays. This object is achieved by overcoating the wire skeleton with at least one coating having a predetermined combination of thickness, yield strength and elastic modulus to ensure predetermined force-to-deflection characteristics of resulting spring contacts.

Yet another object of the present invention is to produce protruding contacts on top of (or otherwise protruding from) a multitude of contact-carrying terminals, where the terminals have varying vertical coordinates, corresponding to an origin point of the protruding contacts, while uppermost points of the protruding contacts extend to a vertical coordinate which is substantially identical, within a permissible tolerance level for the component or substrate which is to be subsequently connected to the contacts. In a different embodiment related to this object, the terminals can originate on various electronic components, while the protuberant contacts extend to a substantially identical vertical coordinate. This object is achieved by controlling a wire severing step, by always severing the wire at a predetermined vertical coordinate. Overcoatings then follow the skeleton wire shape and geometry, yielding a contact having a controlled vertical coordinate level, regardless of the Z-axis point of origination of the contact, e.g. plane of the terminal. Some of the terminals having varying Z-coordinates and overlying the component, can optionally and additionally overlie single or multiple electronic devices, placed on the electronic component. In another embodiment related to this object of the present invention, the vertical coordinate of the tips of the protuberant contacts can be controlled by the software algorithm of the appropriately arranged automated wirebonding equipment.

BRIEF DESCRIPTION OF THE DRAWINGS

The foregoing and other objects and advantages will appear more fully from a Detailed Description of the Invention which follows viewed in conjunction with drawings which accompany and form part of this Application. In the drawings.

DETAILED DESCRIPTION OF THE INVENTION

Figure 1A:
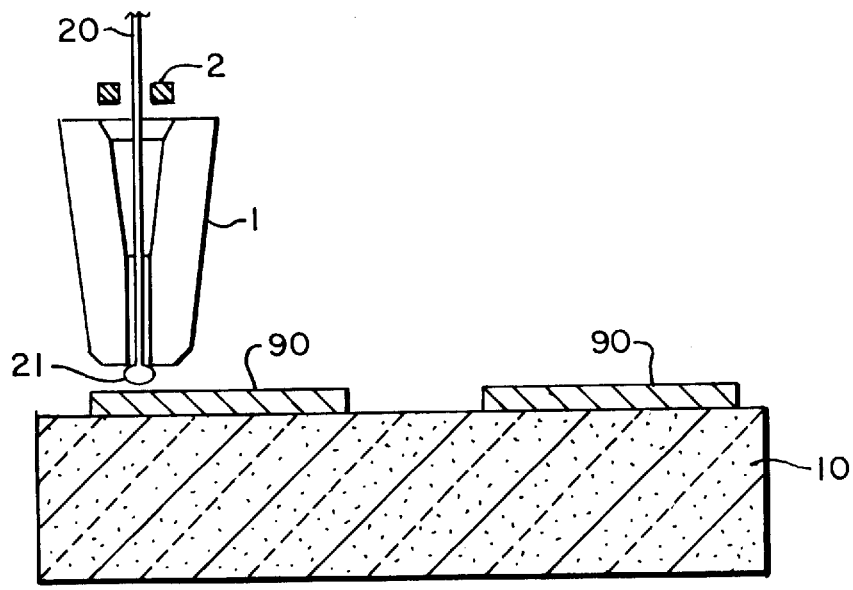
FIGS. 1a and 1b are schematic representations of a known ball-and-wedge technique to form a loop-like wire skeleton of a protruding electrical contact.
Figure 1B:
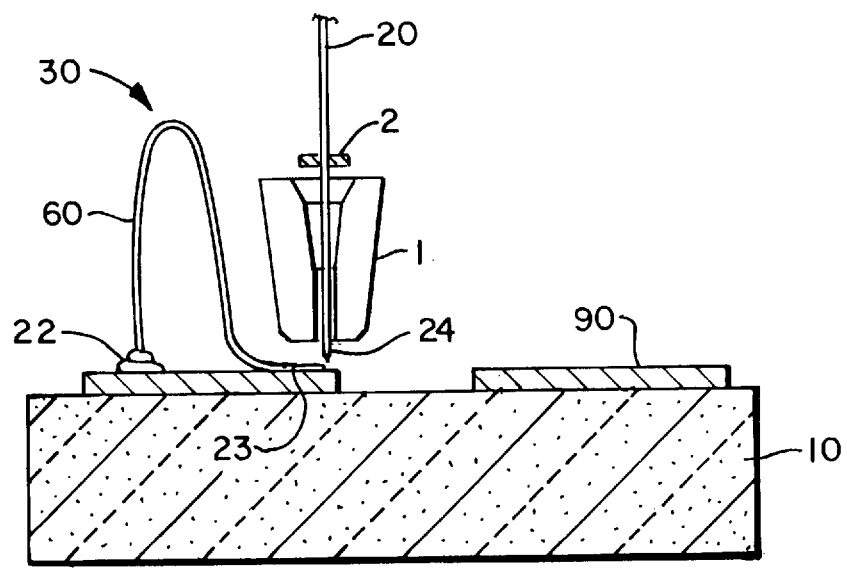

The method of the present invention employs wirebonding equipment to produce controlled aspect ratio and shape wire skeletons, which are subsequently overcoated with a desired material in order to produce a required (desired) set of properties for protuberant electrical contacts. FIGS. 1A and 1B depict use of a ball-and-wedge wirebonding machine to form a wire skeleton. More detailed descriptions of this and wedge-wedge wirebonding methods, commonly used in the semiconductor industry for interconnecting silicon devices to packages, can be found in *Electronic Packaging and Interconnection Handbook* edited by Charles A. Harper, on pp. 6.62–6.64 and 7.28–7.30. FIG. 1A illustrates a capillary 1, with an open clamp 2, containing an end portion of a continuous wire 20 with a ball 21 formed at its feed end below the capillary tip. The ball 21 is brought in contact with a contact carrying terminal 90 on top of (or otherwise contained within) a substrate 10. As a result of application of pressure, temperature or ultrasonic energy, or combinations thereof, a ball is bonded to the terminal. The ball 21 in FIG. 1A is in the bonding process changed into ball bond 22 shown in FIG. 1B. Subsequent motion of the capillary sets the shape of a wire stem 60. Loop geometry of the wire stem is controlled by parameter settings in the software control algorithm of the wirebonding equipment. A second end of the wire stem is bonded to the terminal 90 by means of pressure, temperature or ultrasonic energy, and deforming the wire against the terminal 90. A wedge-shaped joint 23 is thereby produced. The capillary then rises to a predetermined height, a clamp 2 closes, and the wire is severed at a thinnest point of the joint 23, leaving a fractured free end 24 below the capillary 1. In preparation for forming a next joint, a next ball 21 is formed at the severed free end 24 of the of the wire underneath the capillary, and the cycle is repeated. The loop-shaped stems can be alternatively produced by wedge-wedge technique, where both end of the stem are bonded by the wedge tool. Wire material for ball-wedge and wedge-wedge type of wire-bonding is most commonly gold, aluminum or copper, with slight modifications by other elements, like beryllium, cadmium, silicon and magnesium to control the properties. Other materials including solder, and specifically lead-tin solder wire, have been employed. Alloys of silver and platinum group elements can also be used for wire material. Gold, aluminum and copper, or alloys based on these metals, are the preferred wire materials. The terminal material should preferably use at least a top layer (if a multi-layer structure) of gold or aluminum, but numerous other metallizations can be successfully used, requiring different levels of ultrasonic vibration, force and temperature. A modern automated wirebonder is capable of bonding over 10 loop-shaped stems per second.

Figure 2:
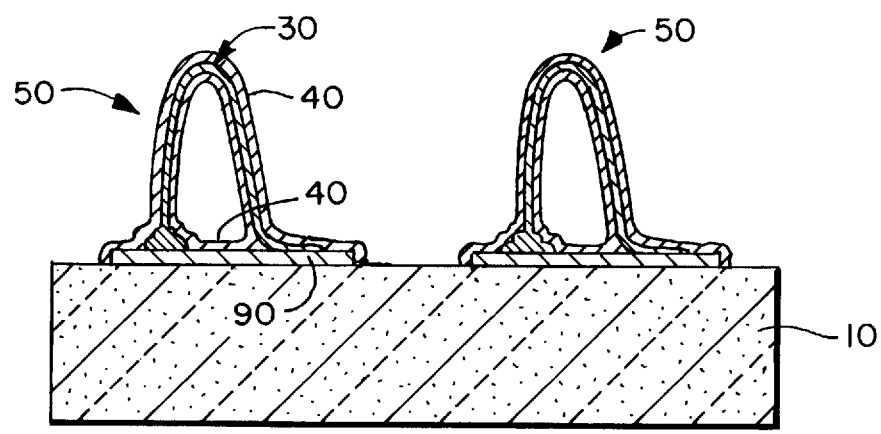
FIG. 2 is a cross-sectional representation of a conductive contact resulting after overcoating the wire skeleton depicted in FIG. 1B.

In the embodiment of the present invention represented in FIG. 1A and 1B, a wire skeleton 30 is formed upon severing the single wire stem 60. As shown in FIG. 2, the skeleton 30 geometrically defines the protuberant contact produced by the method of the present invention.

Referring now to FIG. 2, physical, finishing and determining mechanical and chemical properties of the resulting protuberant contact 50 are provided through overcoating of the skeleton 30 and the contact carrying terminal 90 with a continuous coating 40, which consists of at least one electrically conducting layer. The continuous coating 40 anchors the skeleton to the terminal by bridging in the areas of contact between the ball bond 22 and wedge bond 23 and the terminal. The overcoating material may be significantly stronger than the skeleton material. It can be applied by wet electrochemical means, e.g. through electrolytic or electroless aqueous solution plating of metals on the skeleton and the terminal. The wet plating techniques are, for instance, described in *Metal Finishing Guidebook* annually published by Metals and Plastics Publications, Inc. One preferred embodiment comprises electroplating of nickel out of nickel and its alloys. This method is capable of depositing controlled thickness coating with a tensile strength in excess of 80,000 pounds per square inch. Additional improvement of mechanical strength of the resulting contact is achieved when a coating with a compressive internal stress is deposited, which effectively increases the stress level required to deform or break a resulting protuberant electrical contact.

The coating method also optionally includes so-called physical and chemical vapor methods of conductor material deposition. These optional techniques are detailed in a book by M. Ohring, *The Materials Science of Thin Films*, Academic Press, 1992. Coating methods also include and contemplate deposition of conductors through various decomposition processes of gaseous, liquid or solid precursors.

Nickel has a strong tendency to form an oxide and is, therefore, not the best choice as a contact metal. It requires large contact forces to break through the oxide. For low contact force applications, it requires a second noble or semi-noble coating layer on top. Gold, silver, elements of the platinum group and their alloys are preferred choices as a noble or semi-noble overcoating layer. Similarly, in other instances, multiple layers, comprising conductive overcoating 40, can be selected to tailor the set of properties of the protuberant contact to a given application.

Figure 3:
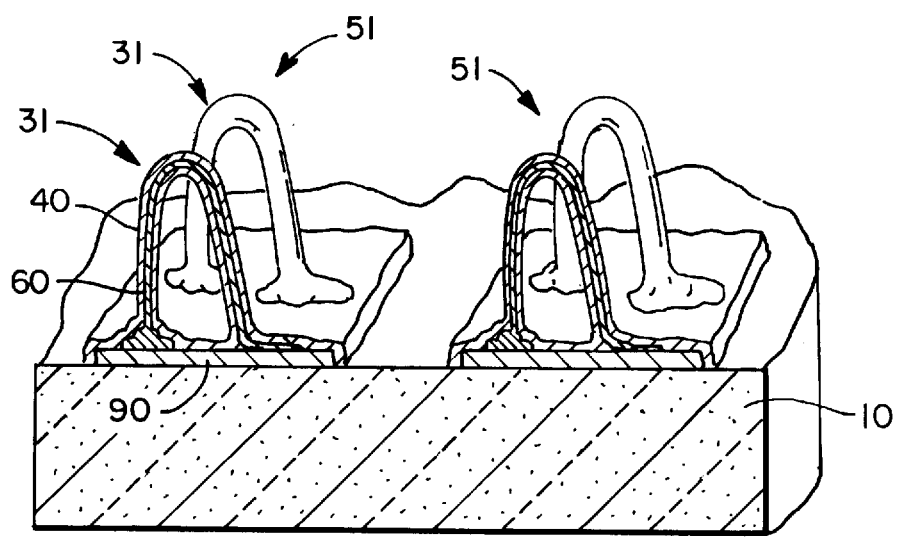
FIG. 3 is a schematic representation of a conductive contacts with skeletons consisting of two loop-like stems.

Within the method of the present invention, a plurality of wire stems can be employed to create a wire skeleton. Referring now to FIG. 3, two wire stems 60 comprise each skeleton 31. Conductive overcoating 40 completes protuberant contact 51.

Figure 4:
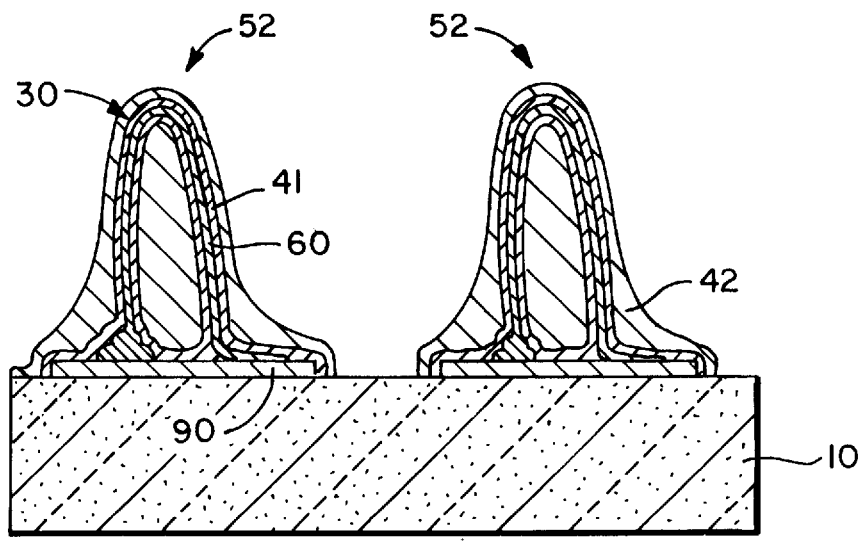
FIG. 4 is a cross-sectional representation of protruding solder contacts based on loop-like skeletons with a barrier metal between the wire material and the solder.

In a growing number of applications there is a requirement for controlled aspect ratio columns of solder on top of an area array of terminals on ceramic and plastic semiconductor packages. Most often, an area array of balls made of a solder alloy, commonly a eutectic alloy of lead and tin, is used in surface mounting of components with an array of terminals to a matching array of contacts on a circuit board. Long term resistance of such solder contacts is determined by the height, shape and the material characteristics of the solder joints. The method of the present invention provides for controlled shape solder contacts formed around a wire skeleton. Referring now to FIG. 4, wire skeletons 30 are first coated with an optional barrier layer 41, and in the following step are overcoated by a solder mass 42. The barrier layer 41 inhibits an undesired reaction between the wire material and the solder mass. This barrier layer is especially important in the embodiment of the invention providing for gold wire skeletons and a solder mass comprising an alloy of lead and tin. Due to reactivity between gold and tin, and detrimental effects of intermetallic, gold-tin compounds on the service performance of solder joints, the reaction between gold and tin must be prevented. A 100 to 1,000 microinch barrier of a nickel alloy is typically a sufficient deterrent to the reaction between solder and gold for most applications.

Deposition of solder overcoating can be accomplished, for example, by sending a package or a substrate through a solder wave process cycle in a solder wave equipment. The solder wets the barrier layer 41, and bridges among adjacent wire portions forming the loop-shaped stems, to assume a shape depicted in FIG. 4. The shape does not substantially change during subsequent reflow cycles, as long as there is no significant reaction between the solder and the barrier coating. The overall shape of the solder column depends on area of the terminal and geometry of the skeleton. Bridging by molten solder masses between the ascending and descending branches of loop-shaped stems, and the surface of the terminal, enables the skeletons to contain and support disproportionately large volumes of solder. A preferred solder protuberant contact produced by the method of the present invention will contain more than 70 volume percent of solder, and more preferably over 80 volume percent of solder by volume, with the remainder comprising the skeleton and the barrier material.

A preferred embodiment for a solder column contact, depicted in FIG. 4, is a gold based alloy wire loop skeleton 30, with a nickel based coating 41, and a near eutectic lead-tin solder mass 42. The gold wire diameter usually ranges between 0.0005 and 0.005 inches, and preferably between 0.0007 and 0.003 inches. The nickel overcoat 40 usually ranges in thickness between 0.00005 and 0.007 inches, and preferably between 0.00010 and 0.003 inches. Another preferred embodiment is a copper alloy wire skeleton, which can be directly overcoated with solder mass. In another preferred embodiment, copper based wire skeleton is first overcoated with a nickel based barrier layer, followed by deposition of the solder material.

Both types of protuberant contacts, solder contacts 52 shown in FIG. 4, and contacts 50 shown in FIG. 2, can be soldered to an interconnection substrate or a component using surface mount soldering technology. Solder contacts 52 have an advantage in handling prior to processing, in that solid solder mass 42, FIG. 4, bridging between the wire branches of the skeleton and surface of the terminal, makes the contact more resistant to mechanical damage in handling, e.g. bending and breakage.

Figure 5:
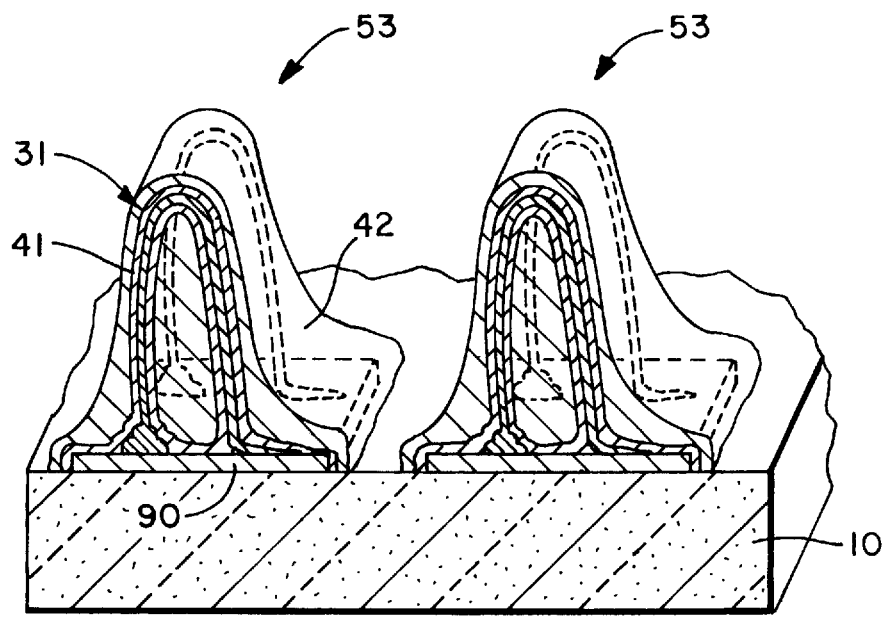
FIG. 5 is a schematic representation of protruding solder contacts where each skeleton consists of two loop-like stems, the skeleton material overcoated with a barrier layer prior to deposition of solder.

Further increase of the overall proportion of solder material in protuberant solder contacts can be achieved by using multiple wire stem skeletons. Referring now to FIG. 5, two severed stems 60 comprise each skeleton 31 bonded to a contact carrying terminal 90. An optional barrier material 41 is first deposited on top of the terminal 90 and the skeleton 31, in order to inhibit a possible reaction between the solder and the skeleton material. A solder material 42 completes the construction of a protuberant solder contact. By presenting more ascending and descending wire branches for solder bridging, the relative volume content of solder material in the protuberant contact can be significantly increased.

Protuberant solder contacts 52 and 53 in FIG. 4 and FIG. 5, substantially retain their shape even during subsequent solder reflows, due to strong wetting between the solder and the barrier layer 41. This shape retention is despite solder constituting preferably more than 70 volume percent of the protuberant contacts 52 and 53, and most preferably more than 80 volume percent. This property of protuberant solder contacts produced by the method of the present invention allows for contacts to be put on electronic components prior to device assembly steps, even if the assembly process involves heating the component 10 above the melting temperature of solder material 42.

Figure 6A:
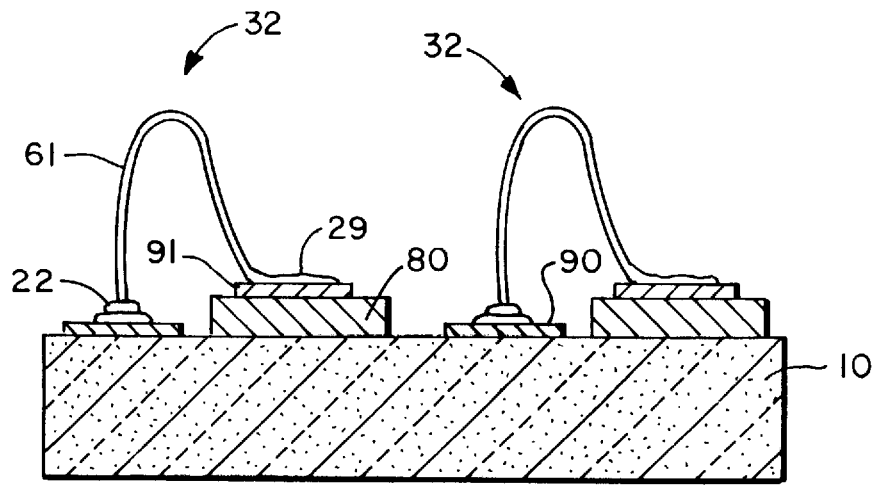
FIGS. 6a, 6b and 6c depict a sequence of bonding one end of a loop-like stem to a sacrificial pad, overcoating the skeleton, and a following step of removal of a sacrificial pad, resulting in protuberant contact with a floating end.
Figure 6B:
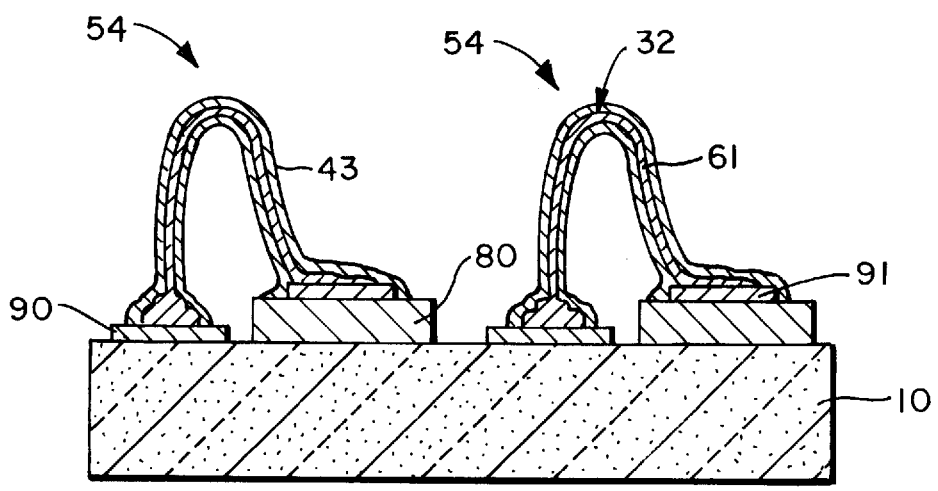
Figure 6C:
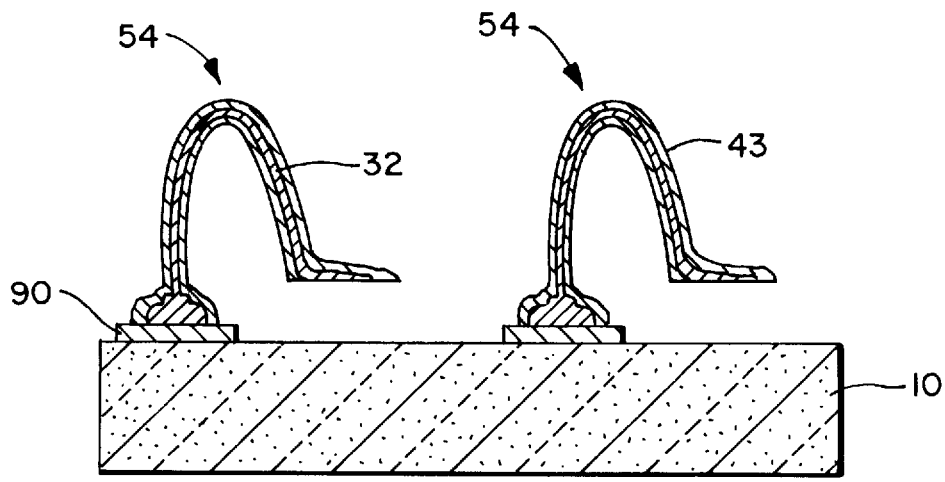

In the spirit of the present invention, but in yet an alternate embodiment, either the ball or a wedge bond of the wire stem can be formed outside the area of a contact carrying terminal. As shown in FIG. 6A, a wedge bond 29 completes a wire stem 61, and upon the severing step at the bond 29, resulting in formation of a wire skeleton 32. The wedge bond 29 is formed outside the area of the terminal 90 at a terminal 91. The terminal 91 is positioned on top of a sacrificial layer 80, or could optionally be sacrificial by being comprised of a dissimilar metal from that of terminal 90. In both cases, the sacrificial arrangement is temporarily used for electrical contact to an electrode, in that it is required for electroplating of a conductive coating 43, enveloping the skeletons 32 and the terminals 90 and 91, to complete protuberant conductive contacts 54, as illustrated in FIG. 6B. The sacrificial layer is also used for assuring a different Z-axis coordinate for the bonds 22 and 29. As illustrated in FIG. 6C after a coating deposition and a removal step for the sacrificial layer, one of the ends of the wire loop based contact ends up being suspended above the substrate 10. This suspension is especially important for formation of controlled geometry spring contacts, capable of resiliently engaging with mating terminals on a component or a substrate for testing, burn-in or demountable electrical interconnect in service. The variation of the Z-coordinate of an end of the wire-loop shaped contact allows for resilient Z-axis movement of a tip of the resulting spring when a force is applied thereto.

Figure 7A:
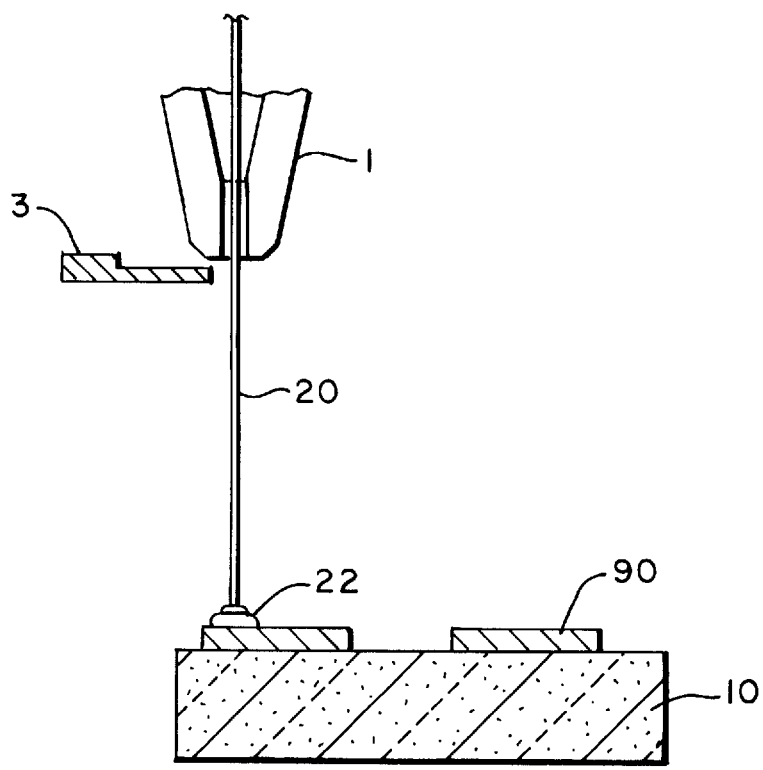
FIGS. 7a, 7b and 7c represent schematically a sequence of bonding single stem, perpendicular skeletons to contact-carrying terminals.
Figure 7B:
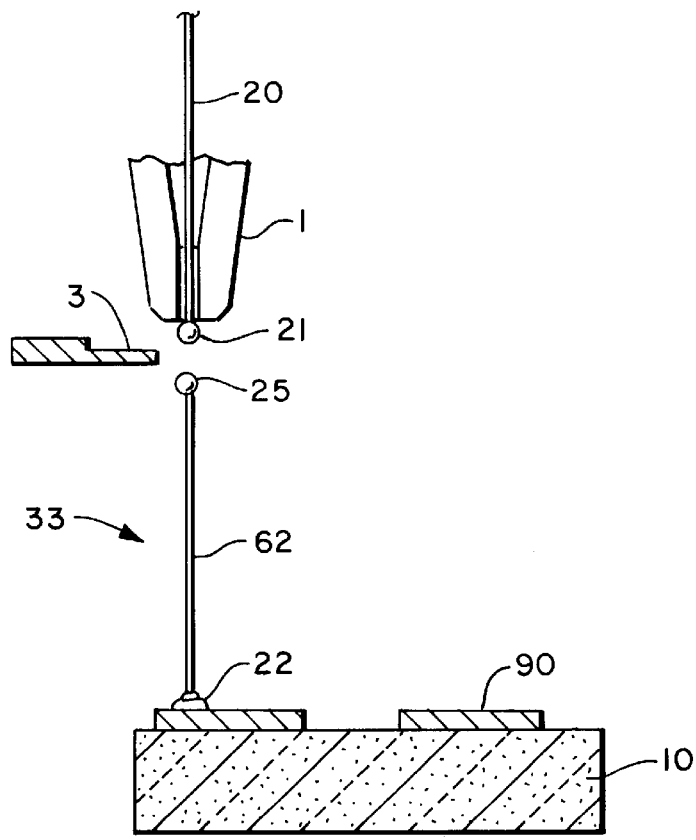
Figure 7C:
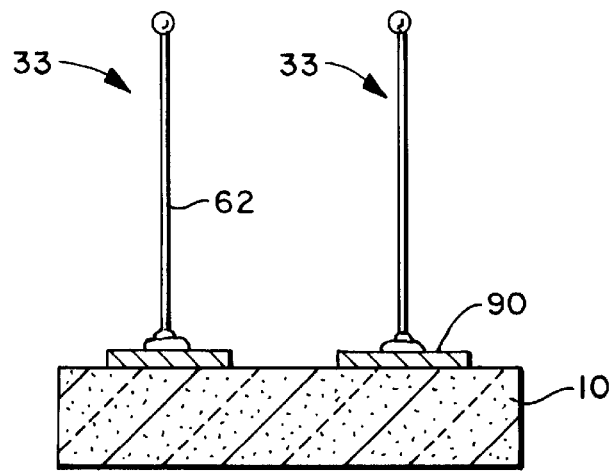
Figure 8:
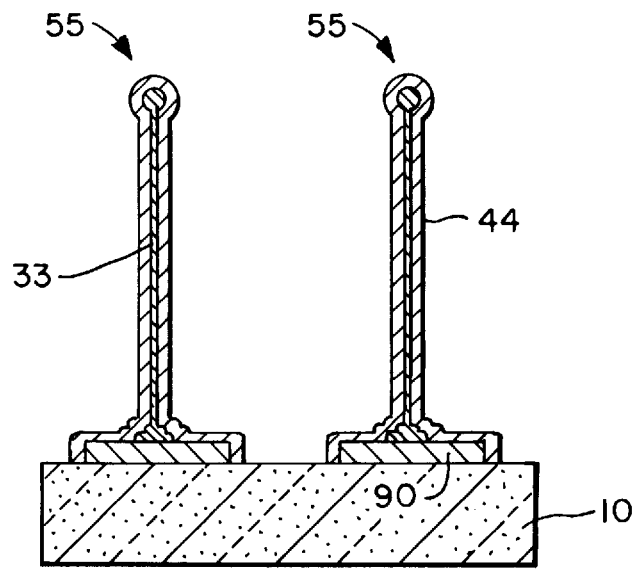
FIG. 8 is a cross-sectional view of vertical protuberant contacts produced by overcoating the skeletons depicted in FIG. 7c.

Referring now to FIGS. 7A through 8, another preferred embodiment of the method for manufacturing controlled aspect ratio protuberant contacts. In this embodiment, only ball bonding is used, the wires are bonded substantially vertically. The software of the control system of the wirebonder is programmed to exclude the common wedge bonding step for severing the wires. Instead the same electronic or hydrogen flame-off used for ball formation prior to the ball bonding is employed to sever the wires at a predetermined height. FIG. 7A depicts a ball bonding capillary 1, wire 20 after the first bail bonding step which created a ball bond 22 on top of contact carrying terminal 11. After the bond the capillary moves up to a predetermined position, and electrode 3 is brought under a high potential, resulting in a generation of a spark which melts and severs the wire 20 at a predetermined spot, as illustrated in FIG. 7B. As a result of the severing step a wire skeleton 33 is created, which comprises a single stem 62 extending to its severed end 25. The severing step also readies the feed end 21 of the wire 20 to the next stem bonding step.

After vertical wire stems 62 are formed on contact carrying terminals 90, and after the severing step which defines single stem skeletons 33, as shown in FIG. 7C, the wire skeletons 33 and the contact carrying terminals 90 are overcoated with a deposit 44 (see FIG. 8), originating at the terminals and extending to the tops of the wires as a continuous blanket coating, to complete protuberant contacts 55. As in the previous embodiments, the composition and the thickness of the continuous coating is selected to satisfy requirements of a given application.

The protuberant vertical contacts 55 shown in FIG. 8 are especially useful as a replacement method for standard techniques for attachment of pins to plastic and ceramic semiconductor packages, a method which results in lower package cost and reduced pinned package production time. This usefulness is due to the fact that the pin-shaped contacts produced by the method of the present invention do not require pattern specific tooling or molds.

Thickness and material composition of conductive layer 44 shown in FIG. 8 depends on the production, assembly and service requirement, and the characteristics of package material. The layer 44 can comprise nickel alloy. In another embodiment layer 44 can comprise a copper alloy. Yet in another embodiment layer 44 can comprise alloys of nickel, iron and cobalt, with controlled thermal expansion characteristics. In yet additional embodiment, layer 44 is formed through multiple deposition steps, the top deposit comprising a noble or semi-noble metal or alloy, out of a group of gold, platinum, silver, rhodium, ruthenium and copper. The top deposit improves electrical contact characteristics of the pin-like contact 55.

Figure 9:
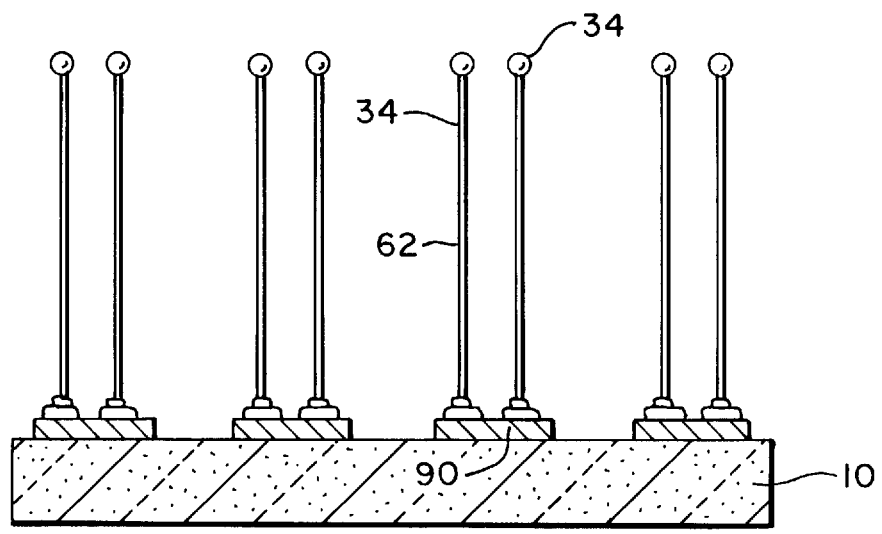
FIGS. 9 and 10 schematically represent an example of the skeletons based on two single stems perpendicular to the plane of contact carrying terminals, and the protuberant contacts resulting after overcoating skeletons shown in FIG. 9 with contact material.
Figure 10:
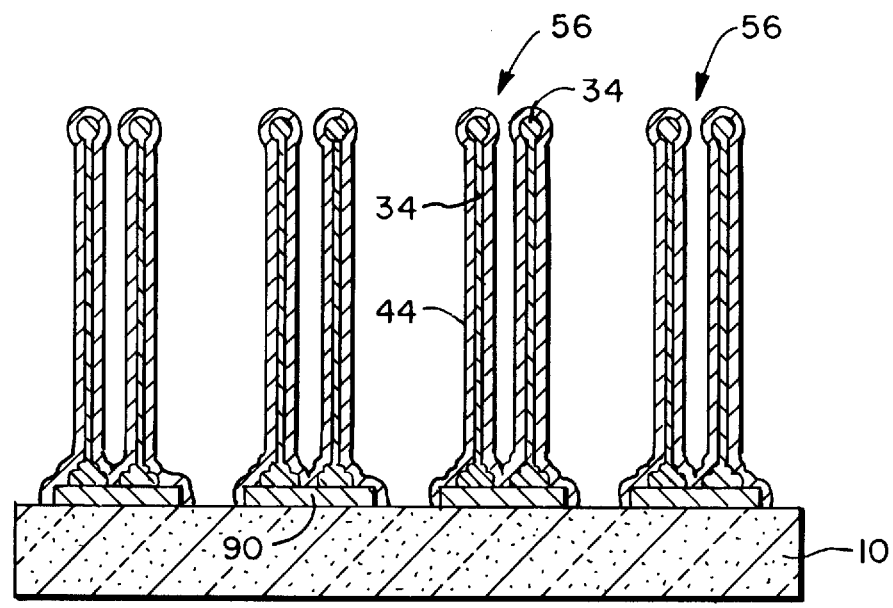

FIGS. 9 and 10 illustrate the process of attachment of contacts 56 to the contact carrying terminals 90. The contacts are based on skeletons 34, each skeleton 34 comprising two vertical wire stems 62. The skeletons and the terminals 90 are overcoated by layer 44 to complete protuberant, vertical-double-stem contacts 56. This type of contacts can be useful in soldering, where multiple branches of the contact present themselves to solder for improved assembly yield.

Figure 11:
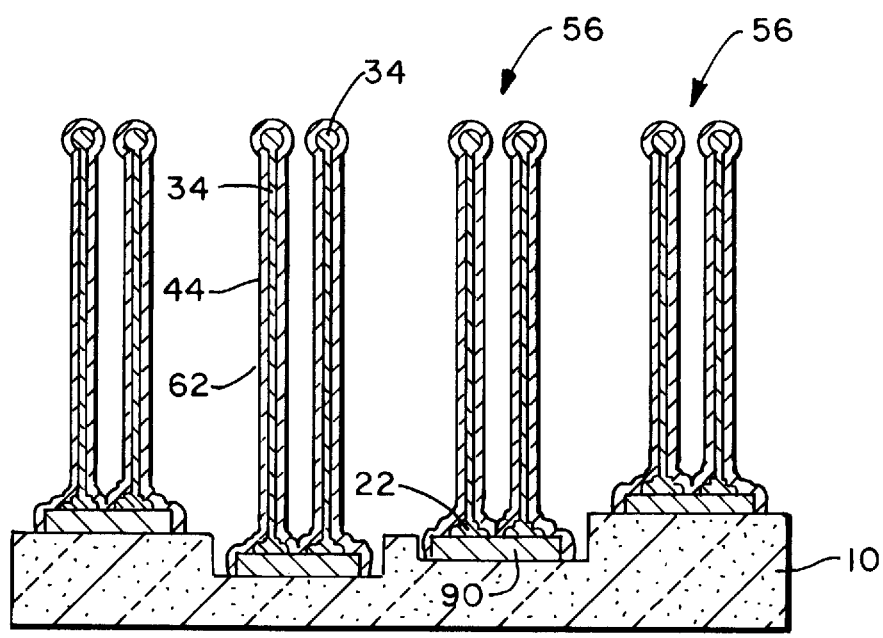
FIG. 11 is a schematic representation of protuberant contacts originating on terminals lying in different planes, and with tips of the contacts lying in a common horizontal plane.
Figure 12:
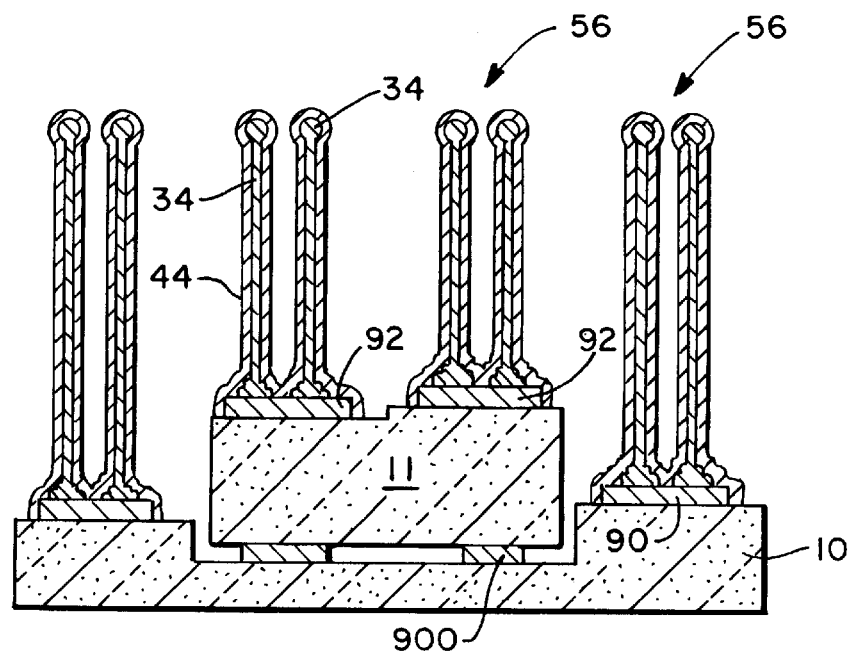
FIG. 12 is a schematic representation of protuberant contacts originating on terminals lying two distinct electronic components, and with tips of the contacts lying in a common horizontal plane.

Referring again to FIG. 7b, due to the stationary position of the electrode 3, the wire 20 always gets severed at a predetermined elevation, regardless the Z-coordinate of the ball bond 22. Uniform elevation is a very desirable property, especially in cases when contacts are placed on a substrate or a component which is not planar due to manufacturing tolerances, or is warped during thermal assembly or processing steps. In other instances, various terminals 90 on an electronic component 10 are provided in different planes, as illustrated in FIG. 11, while the highest elevation points of the protuberant contacts 56 may be required to lie in a substantially identical horizontal plane. This configuration is especially important when contact carrying terminals lie at different positions of an interconnection substrate, but they bear protuberant contacts which must contact a highly planar device or component. This self-planarizing capability of the method of the present invention is also important when the terminals lie on different components, but the tips of protuberant contacts must terminate in a substantially identical horizontal plane. As illustrated in FIG. 12, terminals 90 and 92 lie on components 10 and 11 respectively, while the protuberant contacts 56 vertically terminate in a substantially identical plane. In the embodiment depicted in FIG. 12, the two components, 10 and 11, are optionally interconnected electrically by means of conductive masses 900. In this embodiment of the invention, component 11 can represent an interconnection substrate, while one or a plurality of components 11 can represent passive devices, like capacitors or resistors. The protuberant contacts may serve for interconnection of a bare, unpackaged semiconductor device (not shown in the FIG. 12) to the interconnection substrate 10. Such an electrical arrangement decreases the inductance value between critical contacts on the semiconductor device and a capacitor component, which improves electrical performance of semiconductor devices operating at high frequencies.

Figure 13:
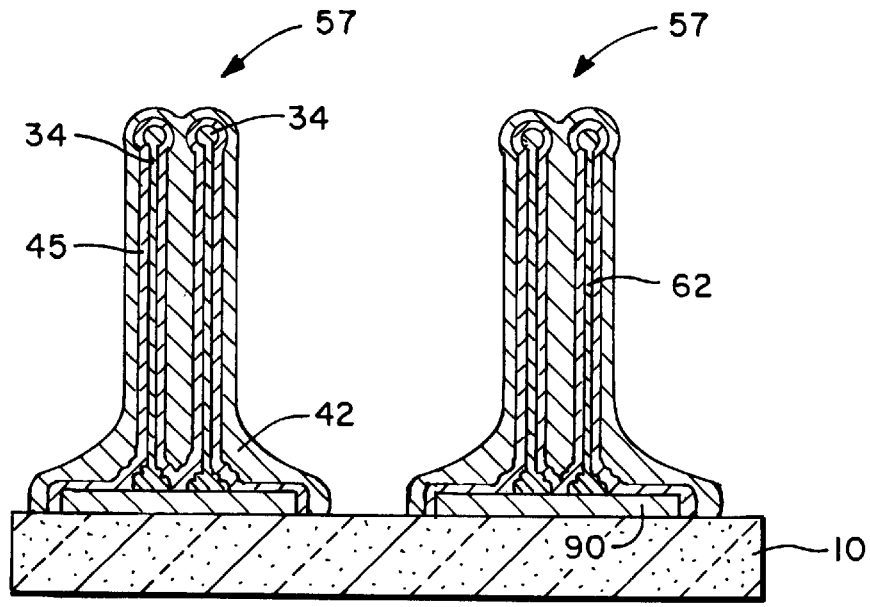
FIG. 13 is a schematic representation of a solder protuberant contact based on a double-stem skeleton, with a barrier layer between the skeleton and the solder.

Wire skeletons consisting of multiple vertical wire stems are especially useful for protuberant solder contact applications. FIG. 13 illustrates a cross section of a protuberant solder contact 57 supported by a wire skeleton 34 consisting of two vertical stems 62. An optional barrier layer 45 is first deposited, followed by the solder 42 deposition step. The deposition step can be accomplished by passing a substrate with protuberant skeletons 34, overcoated with a barrier metal 45, through a common wave soldering machine. The solder bridges between the wires, in addition to coating the outsides and top surfaces of the wires due to wetting. In contrast, a single wire skeleton would support solder only through the wetting mechanism, without a possibility of bridging, and would support less bulk solder per wire as a result of solder application by solder wave technique. A common solder state-of-the-art wave soldering method is described in *Electronic Materials Handbook*, Volume 1 Packaging, from ASM International, Materials Park, Ohio, on pp. 688 through 696. A preferred method for producing this embodiment of the present invention involves use of multiple gold wires, ranging from 0.0005 to 0.005 inches in diameter, and more preferably 0.0007 to 0.003 inches in diameter, overcoated with 0.000030 to 0.005 inches of nickel or nickel alloy or cobalt or cobalt alloy, and more preferably with 0.000050 to 0.003 inches of nickel or nickel alloy. The amount of solder deposited from solder wave would depend on the wave conditions and the dimension of the overcoated skeleton, as well as the size of the contact carrying terminal.

In another embodiment of the present invention, the solder overcoat 42, which completes a protuberant solder contact 57, is a continuous coating deposited over a wire skeleton without a barrier layer between the solder and the wire and terminals. Gold wire without a barrier is not an appropriate choice for this embodiment, because a continuous reaction between the solder and the gold embrittles the solder or solder joint to a substrate or to a component. However, a copper wire is useful to form the wire skeleton, and then a solder coating is applied using, for example, a solder wave approach referred to above.

An alternative approach to forming solder columns on top of wire skeletons is to plate the solder electrolytically. The electrolytically deposited solder is appropriate for standard surface mount assembly. Alternatively, the solder can be reflowed after electrolytic deposition, and prior to the assembly.

Figure 14:
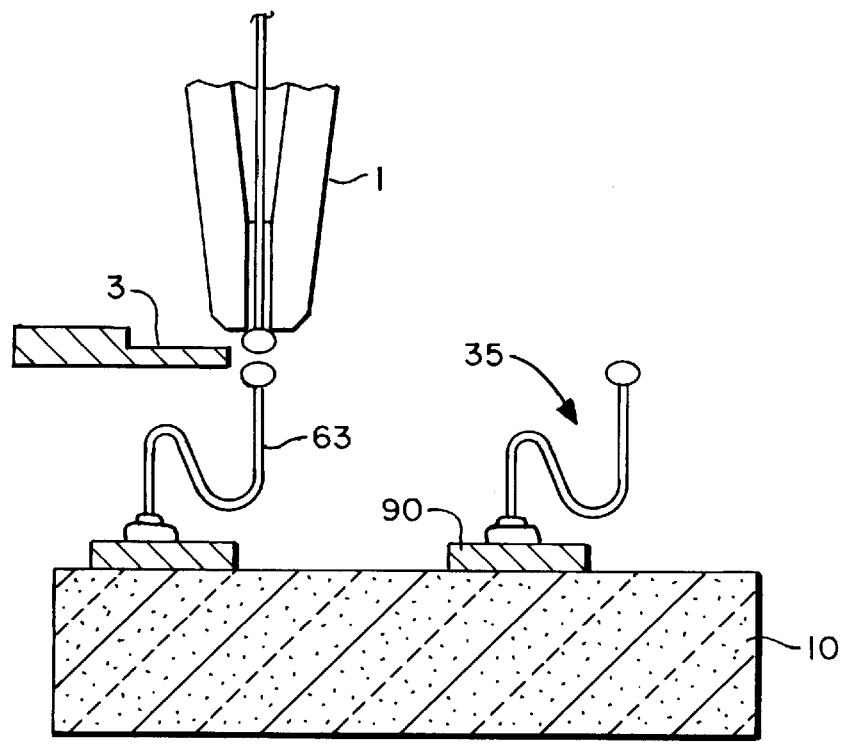
FIG. 14 is a schematic of S-shaped wire skeletons.
Figure 15:
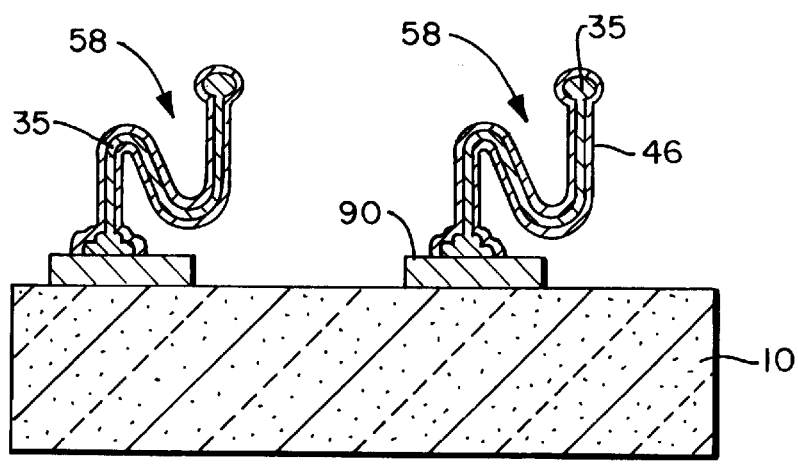
FIG. 15 is a cross-sectional representation of resilient protuberant contacts resulting after overcoating the S-shaped skeletons with an appropriate conductive material.

The method of forming wire skeletons described by means of ball bonding, shown in FIGS. 7A through 7C is appropriate for forming individual resilient contacts. Instead of forming vertical wires, the skeleton wires for spring contacts are formed with the shape which deviates from vertical. One preferred embodiment for forming spring contacts is illustrated in FIGS. 14 and 15. A single or multiple wire is ball bonded to a terminal, followed by a motion of the capillary which forms the wire into an S-shaped wire stem 63. The forming step is followed by a severing step performed by means of an electronic flame-off provided by the tool 3. The severing step defines a skeleton consisting of single or multiple S-shaped wire stems. The skeletons 35 and the resilient contact carrying terminals 90 are then overcoated by a conductive deposit 46, which possesses mechanical characteristics, which, along with the s-shape of the stems, ensures a resilient response of the resulting protuberant contacts 58 to a deflective force.

One preferred embodiment for a resilient overcoating is a nickel or a nickel alloy layer. For example, Ni electroplated out of standard nickel sulfamate solution could be used. Such nickel deposit can be produced with compressive internal stress which would improve the spring characteristics, as well as varying strength and ductility levels. A plated nickel-cobalt alloy has greater strength and improved resilient properties. Rhodium, ruthenium or other elements of the platinum group and their alloys with gold, silver and copper constitute another group of preferred embodiment overcoat materials. Tungsten or nickel can also be deposited by chemical vapor deposition techniques, and represent another preferred embodiment materials.

Gold is the most commonly used wire material for ultrasonic wirebonding applications, but it is soft and it may not be an appropriate skeleton material for a spring contact if it constitutes a significant portion of the spring cross-sectional area. One embodiment of the present invention provides for a common high speed bonding of gold skeleton wires. An alloying layer is then deposited, which when reacted with gold, forms a gold alloy, the alloy having higher strength than pure gold. One preferred embodiment provides for deposition of tin on top of gold wire, with subsequent reaction of gold and tin at a temperature below the melting temperature of gold-tin eutectic. A gold-tin alloy results, which is significantly stronger than gold.

Figure 16:
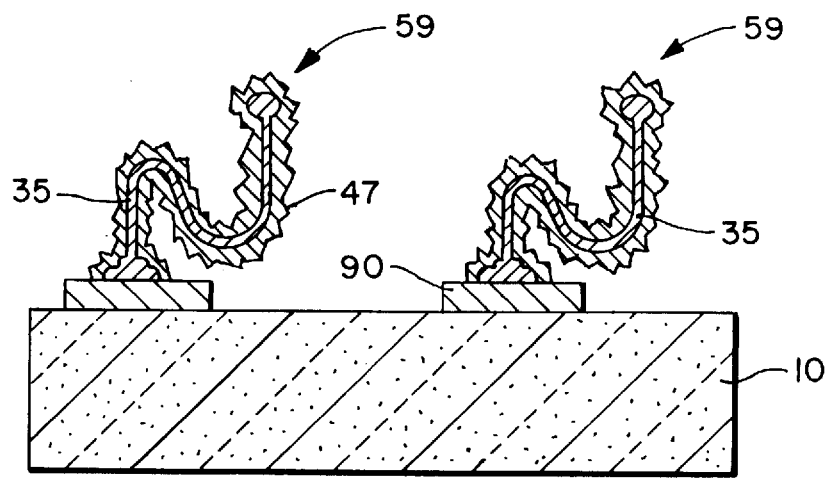
FIG. 16 is a cross-sectional representation of resilient protuberant contacts with microprotrusions for improved contact characteristics.

The contact properties of the springs in FIG. 15 can be enhanced by overcoating the spring material with a noble or semi-noble material, like gold, silver, or elements of the platinum group and their alloys. This overcoating reduces contact resistance of spring contacts 58 when they are engaged against the mating conductive terminals for interconnection purposes. Another embodiment is depicted in FIG. 16, with a spring coating 47 having local protrusions. Such a coating can be created through dendritic growth of an electroplated deposit, or through incorporation of foreign particulates into the conductive deposit 47. Alternatively, a regular uniform first deposit layer can be applied, which provides for resilient properties, and the subsequently deposited top layer incorporates local protrusions or particulates to complete conductive deposit 47. The local protrusions dramatically increase the local pressures exerted by the resilient protruding contact 59 onto a mating terminal during the interconnection engagement, and reduce contact resistance when contacting easily passivating, oxide forming materials overlying the engaged terminals.

Resilient protuberant contact produced by the method of the present invention rely on the shape of a skeleton and the properties of the conductive material for its spring properties. In another embodiment of the present invention, wire stems or wire skeletons can be additionally shaped by a tool external to a wirebonding equipment, prior or before the deposition step.

Figure 17:
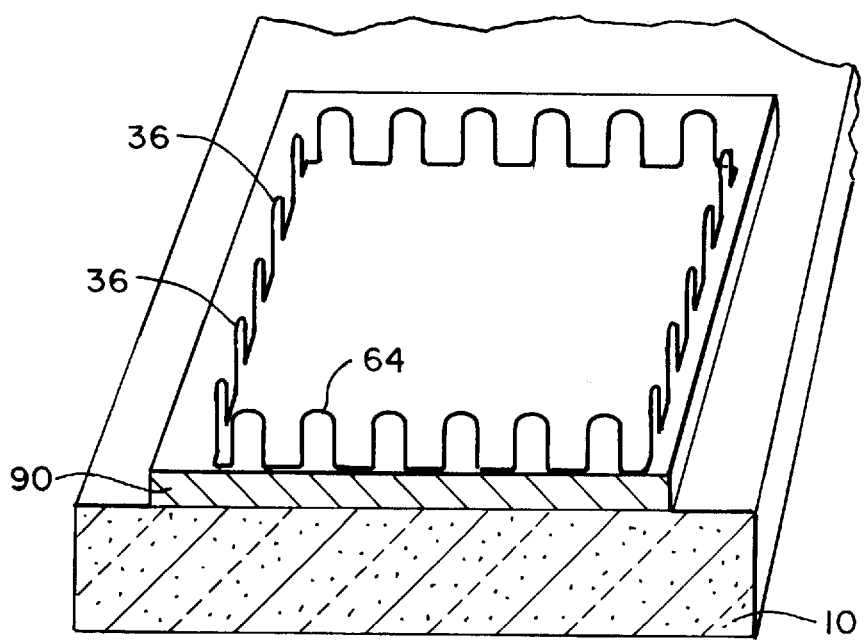
FIG. 17 is a representation of a fence-like skeleton on top of a contact-carrying terminal.

FIG. 17 illustrates another embodiment of the present invention, where a fence-like skeleton 36 is erected on top of a contact carrying terminal 90. The skeleton is formed by sequential bonding of the additional loop-shaped wire stems, without the severing steps between the bonds, until the skeleton is completed. This skeleton shape is especially useful when large masses of solder have to be contained within the spatial boundaries determined by the skeleton 36. One preferred application of this embodiment is production of massive solder pads for thermal interconnection to heat sinks or substrates.

Protuberant contacts, as manufactured according to the present invention, are mounted on terminals on top of various interconnection substrates; such as laminate printed circuit boards, Teflon based circuit boards, multi-layer ceramic substrates, silicon based substrates, varieties of hybrid substrates, and other substrates for integration of electronic systems known to those skilled in the art. The contacts can also be put on top of terminals directly on semiconductor devices, such as silicon and gallium arsenide devices, for subsequent demountable or permanent attachment to interconnection substrates. The contacts could also be put on terminals on one or both sides of electronic components or devices, such as ceramic and plastic packages housing semiconductor components, and other devices. The contacts could be put directly on top of passive devices, such as resistors and capacitors.

Figure 18:
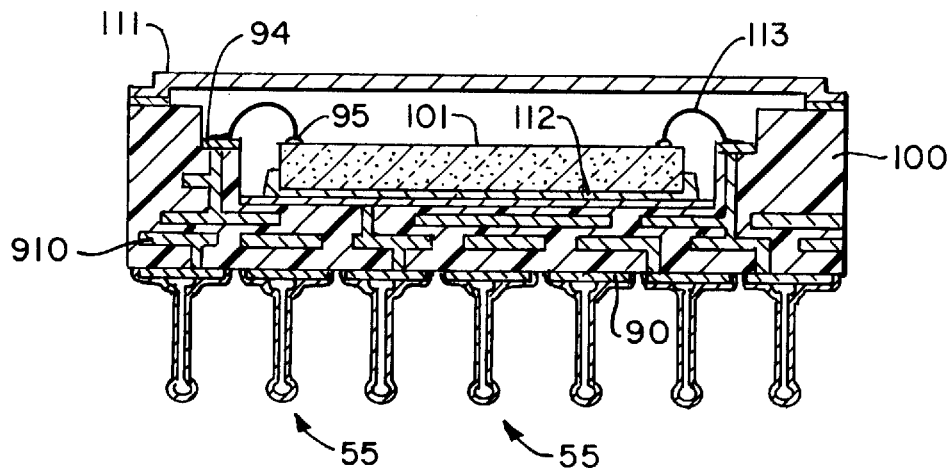
FIG. 18 is a cross-sectional representation of a pin grid array package incorporating pins produced according to the method of the present invention.

One arrangement is shown in FIG. 18, wherein pin-like contacts 55 are mounted to terminals of a ceramic semiconductor package 100. A semiconductor device 101 is bonded to the package using die attach material 112. Electrical interconnection of the device to the package is accomplished with industry standard gold wire bonds 113, extending from terminals 95 on the semiconductor device 101 to terminals 94 on the ceramic package 100. This could alternatively be accomplished with aluminum wire wedge bonding. Interconnectivity within the ceramic package 100, between the wirebond terminals 94 and pin contact carrying terminals 96, is accomplished through the incorporation of conductors 910 within the ceramic package body. The device is sealed hermetically in a package cavity with, typically, a Kovar alloy lid 111. The contacts can be put on before or after attachment and assembly of the semiconductor device 101 in the package 100. The package 100 with the protruding contacts is ready for interconnection to an interconnection substrate, such as a printed circuit board. Depending on the method of connection, top deposit layer of the contacts 55 can be gold, noble or semi-noble material, tin, or a tin-lead solder alloy.

Figure 19:
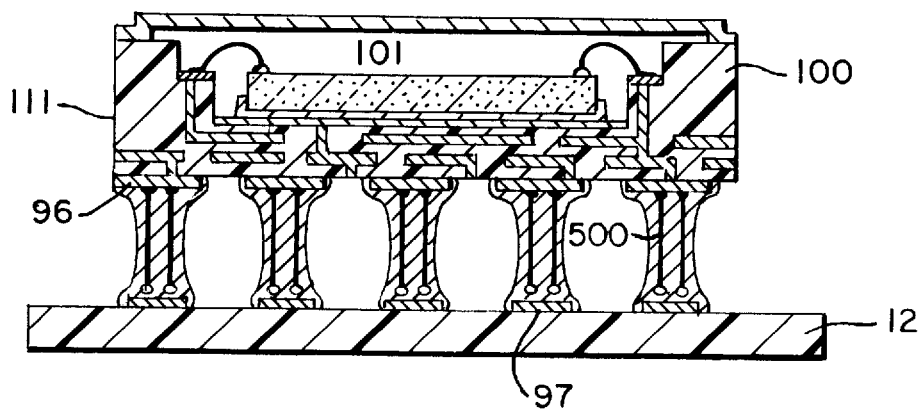
FIG. 19 is a schematic representation of an assembly of a semiconductor package incorporating protuberant solder contacts and an interconnection substrate, after completion of the solder reflow step.

FIG. 19 illustrates a cross section of a semiconductor package 100, with semiconductor device 101 interconnected therewith, and interconnected to a substrate 12 with terminals 97, the pattern of the terminals 97 matching the pattern of contact carrying terminals 96 on the package 100. The package solder column shaped joints between the terminals 96 and 97 resulted after solder attachment of the package 100 with columns 57 to a substrate 12. The surface mount soldering is accomplished preferably by stencil or screen printing solder paste volumes on top of each terminal 97, positioning contacts 57 in contact with said solder paste, reflowing the solder in an oven at a temperature above the melting temperature of the solder in solder paste. Alternatively solder can be applied by various means of deposition, and placement and reflow methods can be utilized. The soldering process follows industry standard procedure commonly referred to as Surface-Mount Technology, and described in Chapter 9 of *Electronic Packaging and Interconnection Handbook*, edited by Charles A. Harper, and published by McGraw-Hill, Inc. As shown in FIG. 19, an hour-glass joint shape results, which is commonly recognized as the most reliable shape for increased resistance to thermally induced joint failures.

Due to the fact that columns 57 can be manufactured with any solder, including eutectic tin-lead solder, the most of the volume of the contact 57 melts during the reflow, and the solder redistributes itself according to the surface area of its reinforcing wire skeleton and the surface area of its mating terminals. This feature allows one to achieve in some cases a self-alignment effect, e.g. the component is pulled into registration with the terminal array on a substrate due to surface forces of solder wetting. This feature is in contrast to other techniques for solder column utilization, which typically use higher melting temperature solder, and only the portions of solder deposited onto terminals on a substrate melt, which reduces the absolute value of solder-surface wetting forces.

Figure 20:
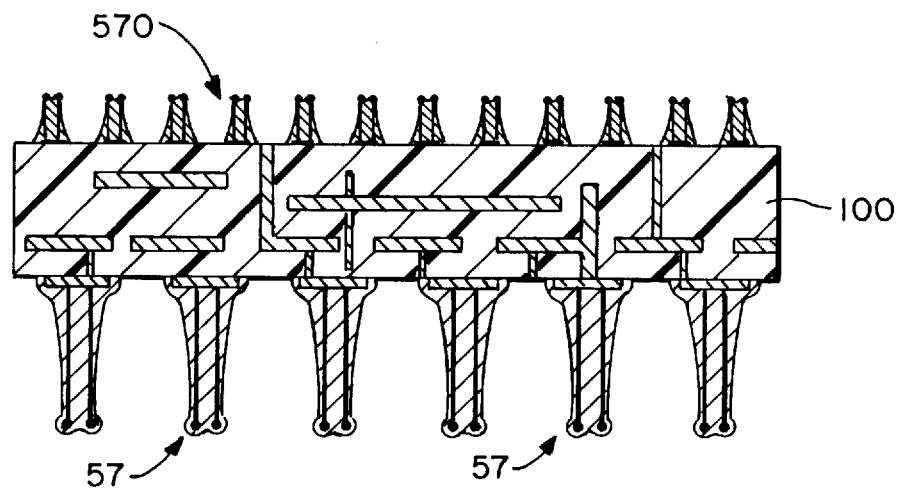
FIG. 20 is a schematic representation of an electronic package, incorporating protuberant solder contacts on its two interconnection surfaces.

The contacts of the present invention can be put on both sides of an electronic package or a substrate for multiple interconnection to various devices. Alternatively, the contacts can be put on one side of an electronic package for interconnection to a semiconductor device, and on the other side of the semiconductor package for subsequent interconnection to a circuit board or any other substrate. FIG. 20 depicts an electronic package 110, which has miniature solder columns 570 for interconnecting a flip-chip semiconductor device, on top of the package, and solder columns 57 at the bottom, for subsequent interconnection to a printed circuit board.

Figure 21:
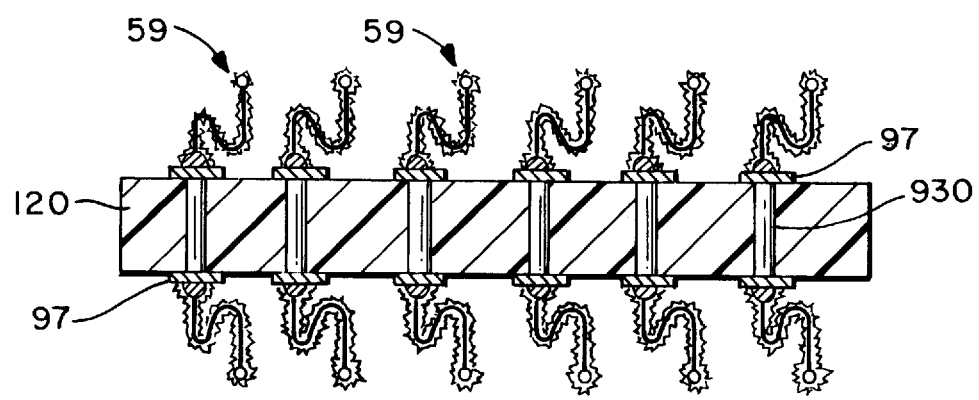
FIG. 21 is a schematic representation of a dielectric interposer with resilient protuberant contacts on its two surfaces, the interposer including means of electrical interconnection between the two surfaces.

Spring contacts produced by the present invention are used as a standard means of interconnect between substrates and components which have matching patterns of terminals. In many cases it is desirable not to manufacture the contacts on either substrates or components, or devices, as the process yield associated with contact manufacturing would cause loss of costly devices, substrates or components. One embodiment of the present invention, illustrated in FIG. 21, provides for a substantially planar interposer 120 with matching set of terminals 97 on both sides thereof, and means 930 for connecting electrically the matching terminals on both of the sides. Protuberant resilient contacts 59 are placed on contact carrying terminals 97 on both sides of the interposer 120. This contact carrying structure is ready for demountable interconnection of a variety of electronic components.

It will be apparent to those skilled in the art that wide deviations may be made from the foregoing preferred embodiments of the invention without departing from a main theme of invention set forth in claims which follow herein.

I claim:

1. A method for mounting a protuberant conductive contact to an electronic component, the method comprising the sequential steps of:

providing a wire having a continuous feed end, bonding the feed end to the component, forming, from the bonded feed end, a stem which protrudes from the component, said stem having a first stem end which is the bonded feed end, severing the stem at a second stem end to define a skeleton, depositing a metallic conductive material to envelop the skeleton and adjacent surface of the component;

further comprising:

prior to the severing step, bonding the second stem end to the component.

2. The method as claimed in claim 1, performed on a plurality of wires on the electronic component.

3. A method for mounting a protuberant conductive contact to a conductive terminal on an electronic component, the method comprising the sequential steps of:

providing a wire having a continuous feed end, bonding the feed end to the terminal, forming, from the bonded feed end, a stem which protrudes from the terminal, said stem having a first stem end which is the bonded feed end, severing the stem at a second stem end to define a skeleton, depositing a metallic conductive material to jacket the skeleton and adjacent surface of the terminal;

further comprising:

before the severing step, bonding the second stem end to the terminal.

4. Method of making raised contact structures on a surface of an electronic component, comprising:

bonding a first end of a first wire to a terminal on a surface of an electronic component;

forming the first wire into a first loop;

bonding a second end of the first wire to the terminal; and overcoating the first wire and the terminal with a conductive material.

5. Method, according to claim 4, further comprising, prior to overcoating the first wire:

bonding a first end of a second wire to the terminal;

forming the second wire into a second loop; and bonding a second end of the second wire to the terminal.

6. Method, according to claim 5, further comprising:

depositing a common conductive coating of solder on the first and second loops and onto the terminal to form a controlled aspect ratio column of solder disposed on the terminal of the electronic component.

7. Method, according to claim 6, further comprising:

prior to depositing the common conductive coating of solder, coating the first and second loops with a barrier layer.

8. Method, according to claim 4, wherein:

the wire is gold; and the conductive material is solder.

9. Method, according to claim 8, wherein:

the solder is an alloy of lead and tin.

10. Method, according to claim 8, further comprising:

prior to overcoating the first wire with solder, disposing a barrier layer on the first wire.

11. Method, according to claim 10, wherein:

the barrier layer is a nickel alloy having a thickness sufficient to deter a reaction between the solder of the conductive coating and the wire.

* * * * *